(12) United States Patent
Ding et al.

(10) Patent No.: US 9,224,685 B1
(45) Date of Patent: Dec. 29, 2015

(54) SHIELDED METAL-OXIDE-METAL (MOM) CAPACITOR STRUCTURE

(75) Inventors: Weiqi Ding, San Jose, CA (US); Wilson Wong, San Jose, CA (US); Shuxian Chen, San Jose, CA (US); Jeffrey T. Watt, San Jose, CA (US)

(73) Assignee: Altera Corporation, San Jose, CA (US)

( * ) Notice: Subject to any disclaimer, the term of this patent is extended or adjusted under 35 U.S.C. 154(b) by 8 days.

(21) Appl. No.: 13/416,137

(22) Filed: Mar. 9, 2012

(51) Int. Cl.
*H01L 23/522* (2006.01)
*H01L 49/02* (2006.01)

(52) U.S. Cl.
CPC .......... *H01L 23/5226* (2013.01); *H01L 23/522* (2013.01); *H01L 23/5223* (2013.01); *H01L 23/5225* (2013.01); *H01L 28/82* (2013.01); *H01L 28/86* (2013.01)

(58) Field of Classification Search
CPC . H01L 23/5226; H01L 23/5225; H01L 28/82; H01L 28/86; H01L 23/522; H01L 23/5223
USPC .................................. 257/308, 309, E21.647
See application file for complete search history.

(56) References Cited

U.S. PATENT DOCUMENTS

2007/0102745 A1* 5/2007 Hsu et al. .................... 257/303

* cited by examiner

*Primary Examiner* — Amar Movva
(74) *Attorney, Agent, or Firm* — Womble Carlyle Sandridge & Rice LLP

(57) ABSTRACT

A metal-oxide-metal (MOM) capacitor structure is disclosed. The MOM capacitor includes a plurality of layers, each layer having a plurality of electrodes. The plurality of electrodes, separated by oxide layers, forms a first plate and a second plate of the MOM capacitor. The plurality of electrodes on each of the layers is coupled to a plurality of electrodes on an adjacent layer through a plurality of vias. A shield layer is coupled to each of the electrodes that forms the second plate of the MOM capacitor on each of the plurality of layers.

15 Claims, 4 Drawing Sheets

SHIELDED METAL-OXIDE-METAL (MOM) CAPACITOR STRUCTURE

BACKGROUND

Integrated circuits (IC) generally include a variety of passive components. Capacitors are among some of the more common passive components that are widely used in ICs for various applications, e.g., mixed signal applications such as filters and analog-to-digital converters. Switched-capacitor circuits, for instance, are widely used in mixed-signal, analog-to-digital interfaces. Switched-capacitor circuits are typically used to perform a variety of functions, among others, sampling, filtering and digitization of signals.

Two capacitor structures that are widely used for such circuits are the metal-insulator-metal (MIM) capacitor and the metal-oxide-metal (MOM) capacitor. Generally, MIM capacitors include an insulator sandwiched between two layers of metals while MOM capacitors are composed of a large number of parallel "fingers" or electrodes formed on numerous metal layers.

In MIM capacitors, there is usually less parasitic capacitance as the top plate is shielded from ground by the bottom plate. As such, only minimal parasitic capacitance exists between the bottom plate and ground. However, MIM capacitors are generally more costly as they may require extra masks in the fabrication process.

Conversely, MOM capacitors can generally be easily fabricated at minimal to no extra cost on the available metal layers on a device. As such, as process technology shrinks, MOM capacitors have been widely used in analog applications due to the increase in capacitance density. However, MOM capacitors may have a higher parasitic capacitance compared to MIM capacitors. As a result of this, circuit operation may be adversely affected. For instance, analog-to-digital converter circuits that use MOM capacitors may suffer from gain error due to the higher parasitic capacitance.

SUMMARY

The following embodiments describe a shielded metal-on-metal (MOM) capacitor structure and techniques for manufacturing such devices.

It should be appreciated that the present exemplary embodiments can be implemented in numerous ways, such as a process, an apparatus, a system, or a device. Several inventive embodiments of the present invention are described below.

In one embodiment, a MOM capacitor structure is disclosed. The MOM capacitor structure has a plurality of layers with a plurality of electrodes. The plurality of electrodes on each of the layers forms a first plate and a second plate and is separated by oxide layers. Each of the layers is coupled to an adjacent layer through a plurality of vias. A shield layer is coupled each of the electrodes forming the second plate on each of the layers.

In another embodiment, another MOM capacitor structure is disclosed. The MOM capacitor includes a plurality of stacked metal layers. Each of the metal layers has a first plurality of electrodes coupled to a first terminal and a second plurality of electrodes coupled to a second terminal. A plurality of vias connects each metal layer to an adjacent metal layer in the plurality of metal layers. A shield layer that is coupled to each of the first plurality of electrodes is formed on a bottom layer of the plurality of stacked metal layers.

In yet another embodiment, a method for forming a MOM capacitor is disclosed. The method includes forming a plurality of metal layers on a substrate. A plurality of first and second electrodes is formed on each of the metal layers. A plurality of oxide layers is formed between the first and second electrodes. A shield layer is coupled to each of the plurality of first electrodes on each of the metal layers.

Other aspects will become apparent from the following detailed description, taken in conjunction with the accompanying drawings, illustrating by way of example the principles of the exemplary embodiments.

BRIEF DESCRIPTION OF THE DRAWINGS

The embodiments may best be understood by reference to the following description taken in conjunction with the accompanying drawings.

DETAILED DESCRIPTION

The following embodiments describe a shielded MOM structure and techniques for manufacturing such devices.

It will be obvious, however, to one skilled in the art, that the present embodiments may be practiced without some or all of these specific details. In other instances, well-known operations have not been described in detail in order not to unnecessarily obscure the present invention.

The embodiments described herein provide techniques for a MOM structure with a shield layer. It should be appreciated that MOM structures are usually used in switched-capacitor (SC) circuits that are widely used in analog-to-digital converter (ADC) circuits. The shield layer reduces the parasitic capacitance, i.e., unwanted capacitance, of the MOM capacitor. The shield layer may be placed on the top plate of the MOM structure or the bottom plate of the MOM structure. In one embodiment, the shield layer has a plurality of interdigitated metal electrodes and in another embodiment, the shield layer is a solid layer.

Figure 1:
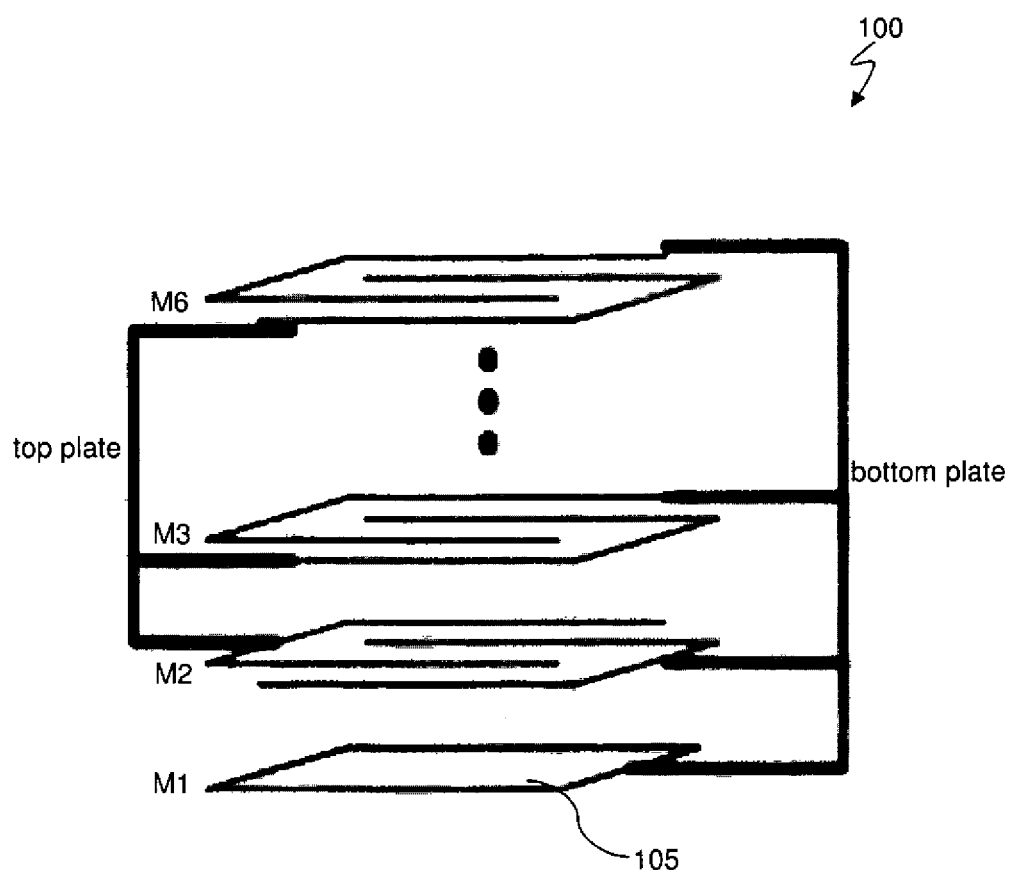
FIG. 1, meant to be exemplary and not limiting, shows a stacked metallization structure of a MOM capacitor according to one embodiment in accordance with the present invention.

FIG. 1, meant to be exemplary and not limiting, shows a stacked metallization structure of a MOM capacitor 100 according to one embodiment in accordance with the present invention. The MOM capacitor 100 includes a plurality of metal layers M1-M6 that are connected to each other and a shield layer 105 placed at the bottom of the plurality of metal layers M1-M6. It should be appreciated that one or more dielectric materials, e.g., metal oxide, may be disposed in between the plurality of metal layers M1-M6. In the embodiment of FIG. 1, the shield layer 105 is coupled to the bottom plate of the plurality of metal layers M1-M6.

Figure 2:
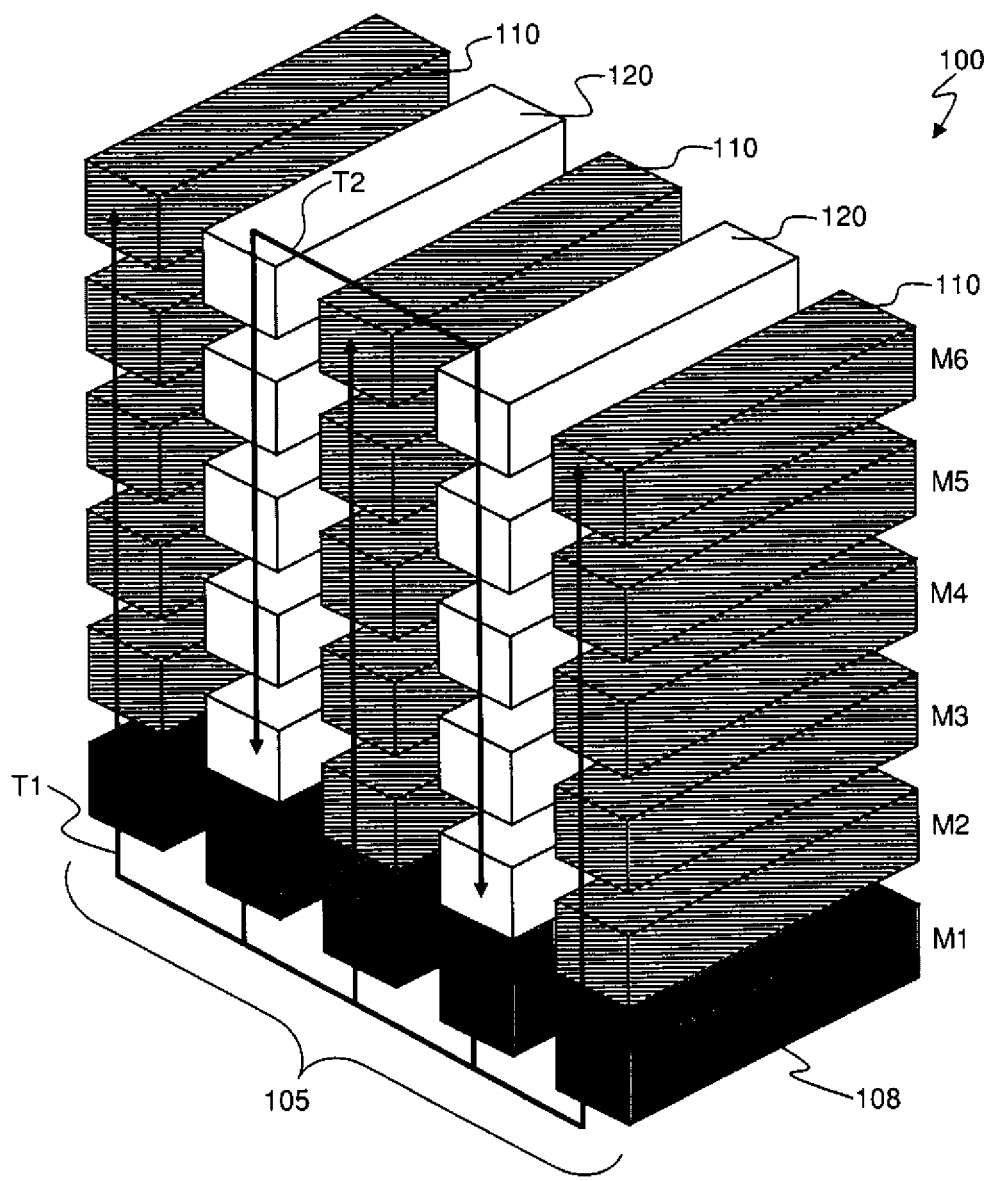
FIG. 2, meant to be exemplary and not limiting, shows a 3-dimensional representation of the stacked metallization structure of the MOM capacitor according to one embodiment of the present invention.

FIG. 2, meant to be exemplary and not limiting, shows a 3-dimensional representation of the stacked metallization structure of the MOM capacitor 100 according to one embodiment of the present invention. The MOM capacitor 100 includes interdigitated fingers 110 and 120 that are formed on each of the plurality of metal layers M2-M6. The interdigitated fingers 110 and 120 on the different metal layers M2-M6 are connected through a plurality of vias and may be separated by oxide layers (not explicitly shown in FIG. 2). It should be appreciated that MOM capacitor 100 is a two-terminal capacitor. In the embodiment of FIG. 2, interdigitated fingers 110 represent a bottom plate of the MOM capacitor 100 and are coupled to terminal T1 while interdigitated fingers 120 represent a top plate of the MOM capacitor and are coupled to terminal T2. In one embodiment, the terminal T1 is coupled to a voltage high level and terminal T2 is coupled to ground. Shield layer 105 is placed on metal layer M1 of the MOM capacitor 100, according to the exemplary embodiment of FIG. 2. In an exemplary embodiment, the shield layer 105 is formed by multiple interdigitated fingers 108 that are shorted together. The fingers 110 on each of the metal layers M2-M6 represent a first terminal and are coupled to the shield layer 105. The fingers 120 on each of the metal layers M2-M6 are coupled to one another, forming a second terminal. It should be appreciated that even though shield layer 105 is shown on a bottom metal layer, i.e., M1 in this embodiment, shield layer 105 may also be placed on a top metal layer, i.e., metal layer M6 in this embodiment, and coupled to the fingers 120.

Figure 3A:
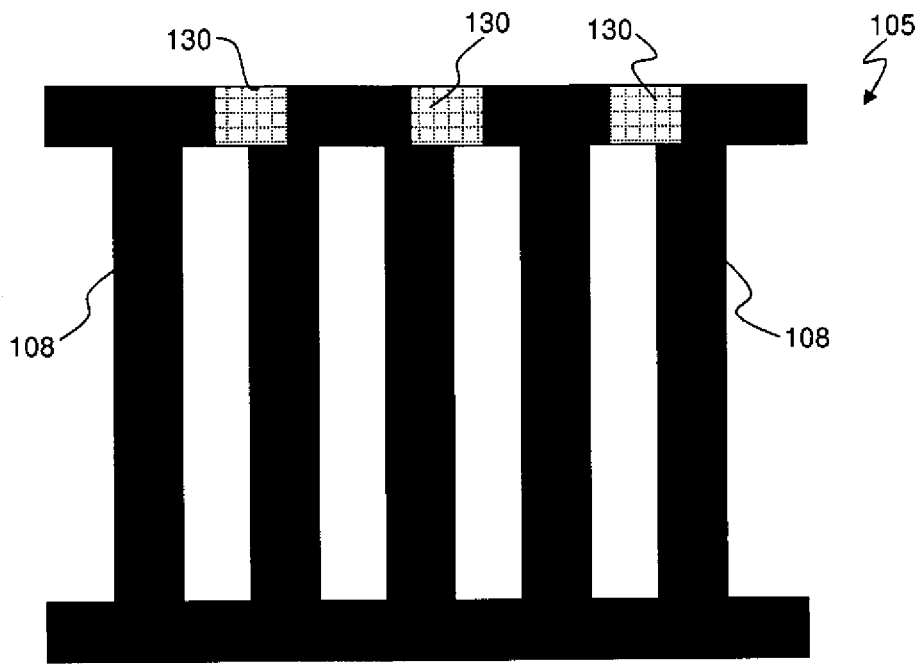
FIG. 3A, meant to be illustrative and not limiting, shows a top-view representation of a shield layer according to one embodiment of the present invention.

FIG. 3A, meant to be illustrative and not limiting, shows a top-view representation of the shield layer 105 according to one embodiment of the present invention. In the embodiment of FIG. 3, shield layer 105 includes a plurality of electrodes 108 that are electronically coupled, or shorted, together. A plurality of vias 130 connects the electrodes 108 to one another in the embodiment of FIG. 3A. Vias 130 also couple the shield layer 105 to electrodes 110 on metal layers M2-M6 of FIG. 2. In another embodiment, shield layer 105 may be a solid layer that is substantially planar to the plurality of metal layers M2-M6 of FIG. 2.

Figure 3B:
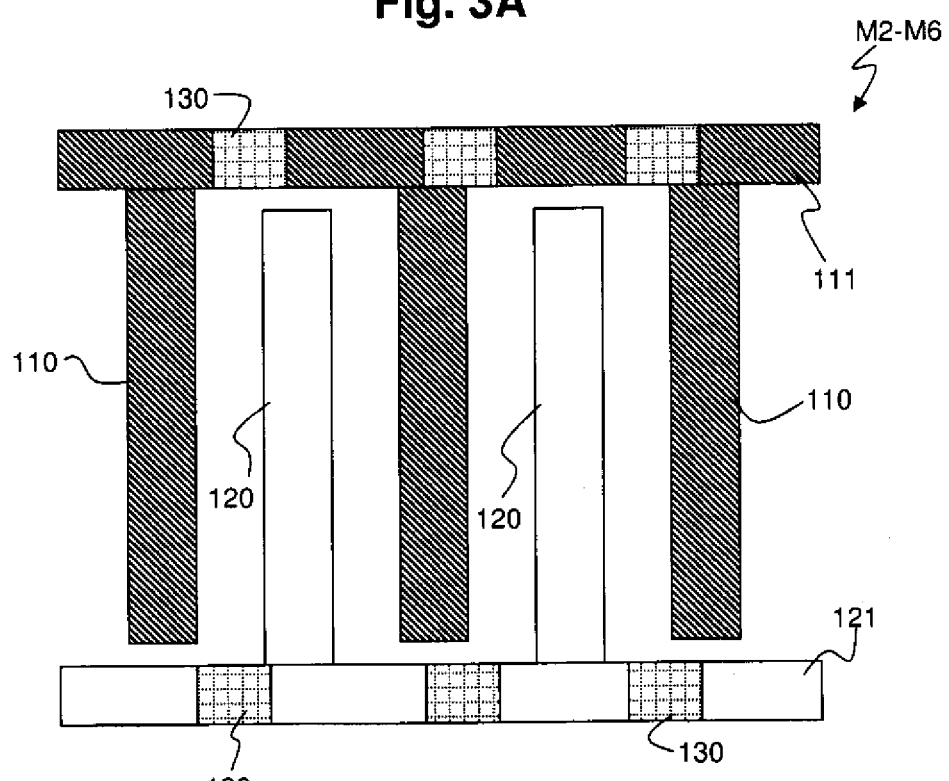
FIG. 3B, meant to be illustrative and not limiting, shows a top-view representation of metal layers M2-M6 of the MOM capacitor in FIG. 2 according to one embodiment of the present invention.

FIG. 3B, meant to be illustrative and not limiting, shows a top-view representation of metal layers M2-M6 of the MOM capacitor 100 in FIG. 2 according to one embodiment of the present invention. Interdigitated electrodes 110 and 120 are formed on metal layers M2-M6. Connection paths 111 and 121 connect each of the electrodes 110 and 120, respectively, on each of the metal layers M2-M6. A plurality of vias 130 connects each of the horizontal connection paths 111 and 121 to a corresponding horizontal connection path on each of the metal layers M2-M6. It should be appreciated that horizontal connection paths 111 and 121 are not shown in the 3-dimensional view of the stacked metallization structure of the MOM capacitor 100 in FIG. 2 in order to not obscure the present invention. In one embodiment, oxide layers separate each of the interdigitated fingers 110 and 120 on each of the metal layers M2-M6.

Figure 4:
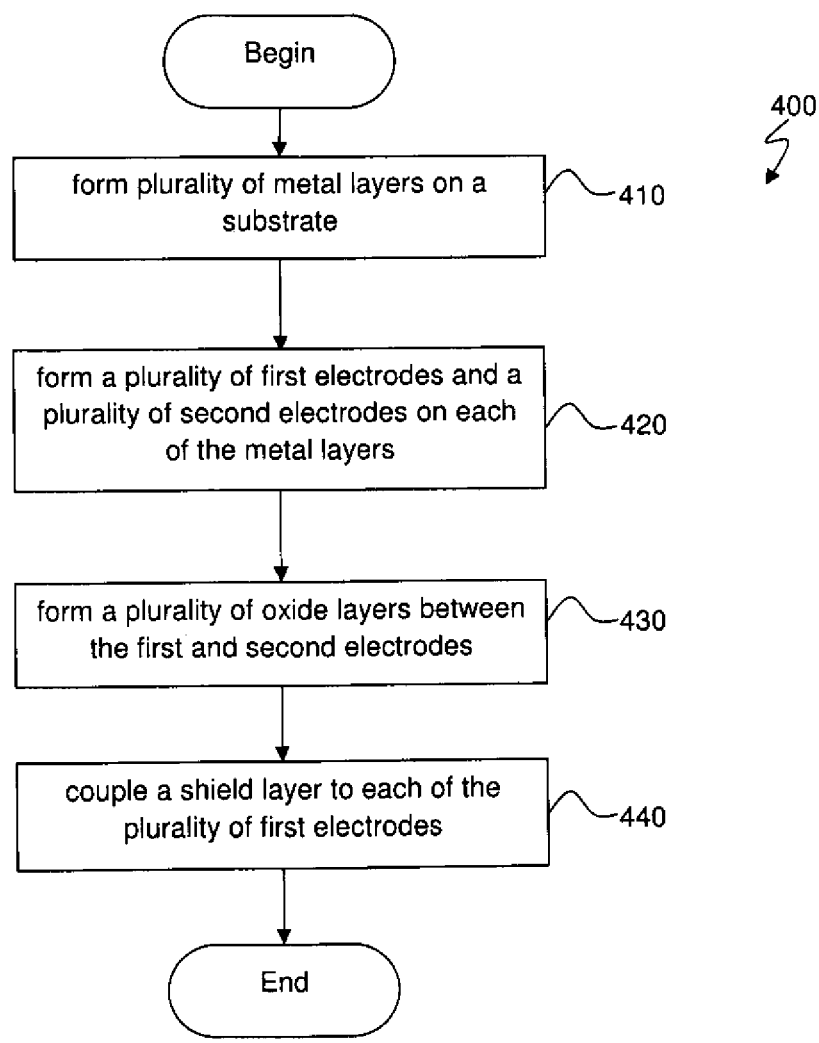
FIG. 4, meant to be illustrative and not limiting, shows a flow for forming a MOM capacitor according to one embodiment of the present invention.

FIG. 4, meant to be illustrative and not limiting, shows a flow 400 for forming a MOM capacitor according to one embodiment of the present invention. Flow 400 begins with forming a plurality of metal layers on a substrate in step 410. A plurality of first electrodes and a plurality of second electrodes are formed on each of the metal layers in step 420. In an exemplary embodiment, each of the plurality of metal layers includes a plurality of interdigitated first and second electrodes similar to fingers 110 and 120 as shown in FIG. 3B. A plurality of oxide layers are formed between each of the first and second electrodes in step 430. A shield layer is coupled to each of the plurality of first electrodes in step 440. In one embodiment, the shield layer is placed on a bottom metal layer of the plurality of metal layers. In another embodiment, the shield layer is placed on a polysilicon layer on the substrate. Vias may be formed to connect the plurality of first electrodes and the plurality of second electrodes on each of the metal layers to corresponding first and second electrodes on an adjacent metal layer.

The embodiments, thus far, were described with respect to integrated circuits. The method and apparatus described herein may be incorporated into any suitable circuit. For example, the method and apparatus may be incorporated into numerous types of devices such as microprocessors or programmable logic devices. Exemplary programmable logic devices include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A metal-oxide metal (MOM) capacitor structure comprising:
   a plurality of layers, wherein each layer of the plurality of layers comprises a plurality of electrodes, the plurality of layers separated by oxide layers, a first portion of the plurality of electrodes forming a first plate and a second portion of the plurality of electrodes forming a second plate, wherein each layer of the plurality of layers is coupled to an adjacent layer through a plurality of vias; and
   a shield layer coupled by a further plurality of vias to the second portion of the plurality of electrodes, a first portion of the shield layer aligned in a first direction with the first portion of the plurality of electrodes and separated from the first portion of the plurality of electrodes by an oxide layer, the further plurality of vias aligned in the first direction with both a second portion of the shield layer and the second portion of the plurality of electrodes, the first portion and the second portion of the shield layer included in a layer devoid of the first plate.

2. The MOM capacitor structure of claim 1, wherein the shield layer comprises a plurality of electrodes.

3. The MOM capacitor structure of claim 2, wherein the plurality of electrodes of the shield layer is a plurality of interdigitated electrodes that are electrically coupled to one another.

4. The MOM capacitor structure of claim 1, wherein the plurality of electrodes is a plurality of interdigitated electrodes.

5. The MOM capacitor structure of claim 1, wherein the shield layer is formed on a polysilicon layer.

6. The MOM capacitor structure of claim 1, wherein the shield layer is formed on one of the plurality of layers.

7. The MOM capacitor structure of claim 1, wherein the shield layer is a substantially planar layer parallel to the plurality of layers.

8. The MOM capacitor structure of claim 1, wherein the first plate is a top plate and the second plate is a bottom plate of the MOM capacitor.

9. A metal-oxide-metal (MOM) capacitor structure comprising:
- a plurality of stacked metal layers, each of the stacked metal layers includes a first plurality of electrodes forming a first plate coupled to a first terminal and a second plurality of electrodes forming a second plate coupled to a second terminal;
- a plurality of vias connecting each metal layer of the plurality of stacked metal layers to an adjacent metal layer of the plurality of stacked metal layers; and
- a shield layer formed in a layer that is distinct from the plurality of stacked metal layers, the layer lacking any and all of the second plate, wherein the shield layer is coupled by a further plurality of vias to the first plurality of electrodes, the further plurality of vias aligned in a vertical direction with both a first portion of the shield layer and the first plurality of electrodes, a second portion of the shield layer aligned in the vertical direction with the second plurality of electrodes, the second portion of the shield layer spaced apart in the vertical direction from the second plurality of electrodes by an oxide layer.

10. The MOM capacitor structure of claim 9, wherein the shield layer comprises a plurality of interdigitated electrodes, wherein each electrode of the plurality of interdigitated electrodes is electrically connected to one another.

11. The MOM capacitor structure of claim 10, wherein each electrode of the plurality of first plurality of electrodes is an interdigitated electrode.

12. The MOM capacitor structure of claim 9, wherein the shield layer is formed on a metal layer.

13. The MOM capacitor structure of claim 9, wherein the shield layer is formed on a polysilicon layer.

14. The MOM capacitor structure of claim 9, wherein the first terminal is coupled to a first voltage level and wherein the second terminal is coupled to a second voltage level.

15. The MOM capacitor structure of claim 9, wherein the MOM capacitor is formed on a programmable logic device (PLD).

* * * * *